US012687791B2

(12) United States Patent
Shen et al.

(10) Patent No.: US 12,687,791 B2
(45) Date of Patent: Jul. 21, 2026

(54) WORKPIECE SUPPORT

(71) Applicant: Taiwan Semiconductor Manufacturing Co., Ltd., Hsinchu (TW)

(72) Inventors: Ming-Yi Shen, Hsinchu (TW); Yao Fong Dai, Hsinchu (TW); Yin-Tun Chou, Hsinchu (TW); Yuan-Hsin Chi, Hsinchu (TW); Sheng-Yuan Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 160 days.

(21) Appl. No.: 17/749,037

(22) Filed: May 19, 2022

(65) Prior Publication Data

US 2023/0375945 A1    Nov. 23, 2023

(51) Int. Cl.
*G03F 7/00* (2006.01)

(52) U.S. Cl.
CPC .......... *G03F 7/707* (2013.01); *G03F 7/70716* (2013.01)

(58) Field of Classification Search
CPC ........ G03F 7/70825; G03F 7/707; G03F 7/70; G03F 7/70691; G03F 7/70716; G03F 7/70725; G03F 7/70733; G03F 7/70741;

G03F 7/7075; G03F 7/70775; G03F 7/70783; G03F 7/70791; G03F 7/708; G03F 7/70808; G03F 7/70816; G03F 7/70975; G03F 7/70991; H01L 21/67742;
(Continued)

(56) References Cited

U.S. PATENT DOCUMENTS 6,559,928 B1 *  5/2003  Aoki .................... G03F 7/7075
                                                                355/72
7,089,073 B2 *  8/2006  Tsuji .................. H01L 21/6838
                                                                700/114
(Continued)

FOREIGN PATENT DOCUMENTS

JP      2004061577 A  *  2/2004
JP      2006210426 A  *  8/2006
WO      WO-2004096679 A1 * 11/2004 ....... H01L 21/68778

OTHER PUBLICATIONS

English translation of JP-2004061577, published Feb. 26, 2004. (Year: 2004).*
(Continued)

*Primary Examiner* — Christina A Riddle
(74) *Attorney, Agent, or Firm* — Seed IP Law Group

(57) ABSTRACT

The present disclosure is directed to workpiece support for supporting a workpiece during semiconductor processing. The workpiece support includes one or more support frame bodies including a plurality of spaced apart spacers on a first surface of the support frame bodies. The spacers include a
(Continued)

first surface spaced apart from the first surface of the support frame body. The spacing between the first surface of the spacers and the first surface of the support frame body results in the underside of the workpiece contacting the spacers but not contacting the first surface of the support frame body. Portions of the underside of the workpiece that do not contact the first surface of the support frame body are less susceptible to damage or accumulation of unwanted debris.

20 Claims, 10 Drawing Sheets

(58) Field of Classification Search
CPC ............. H01L 21/68707; H01L 21/677; H01L
21/67703; H01L 21/67739; H01L
21/683–6835; H01L 21/6838; H01L
21/687–68785; H01L 2221/67; H01L
2221/683; H10P 72/50–57; H10P
72/70–722; H10P 72/74–7406; H10P
72/76–78
USPC ...... 355/18, 30, 52–55, 67–77; 414/935–941
See application file for complete search history.

(56) References Cited

U.S. PATENT DOCUMENTS

| | | | | |
|---|---|---|---|---|
| 2004/0036850 A1* | 2/2004 | Tsukamoto | ............. | G03F 7/707 |
| | | | | 355/75 |
| 2004/0100624 A1* | 5/2004 | Hagiwara | ............... | G03F 7/707 |
| | | | | 355/75 |
| 2006/0290915 A1* | 12/2006 | Bijvoet | ................... | G03F 7/707 |
| | | | | 355/75 |
| 2008/0014075 A1* | 1/2008 | Pun | ...................... | B65G 49/061 |
| | | | | 414/806 |
| 2011/0042874 A1* | 2/2011 | Aoki | ................... | G03F 7/70791 |
| | | | | 29/559 |
| 2013/0269602 A1* | 10/2013 | Miyamoto | .......... | H01L 21/6715 |
| | | | | 118/66 |
| 2017/0165898 A1* | 6/2017 | Meissl | ................. | G03F 7/0002 |

OTHER PUBLICATIONS

English translation of JP2006-210426, published Aug. 10, 2006. (Year: 2006).*
English translation of WO2004/096679 (Year: 2004).*

* cited by examiner

WORKPIECE SUPPORT

BACKGROUND

Advances in semiconductor performance have been driven in no small part by increased manufacturing precision and reduced device geometries. As feature size shrinks, the associated circuits become more sensitive to contamination during the manufacturing process. Generally, in the manufacture of semiconductor devices, robots are often utilized to transfer a workpiece, such as a silicon wafer, between various processing apparatuses such as processing tools. In some system architectures, a workpiece carrier is mounted to an arm of the robot, wherein the workpiece carrier is configured to transport the workpiece between the processing apparatuses. The workpiece carrier may be a transfer blade of the robot that picks up and supports the workpiece while transferring the workpiece within the processing apparatus or between processing apparatuses.

The workpiece transported by the transfer blade of the robot is received and supported by a workpiece support of a processing station of the processing apparatus. The workpiece support supports the workpiece while the workpiece is subjected to the process or processes that are carried out in the processing station. Such processes include semiconductor processes, such as annealing, cooling, material deposition, material removal, material patterning and the like.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
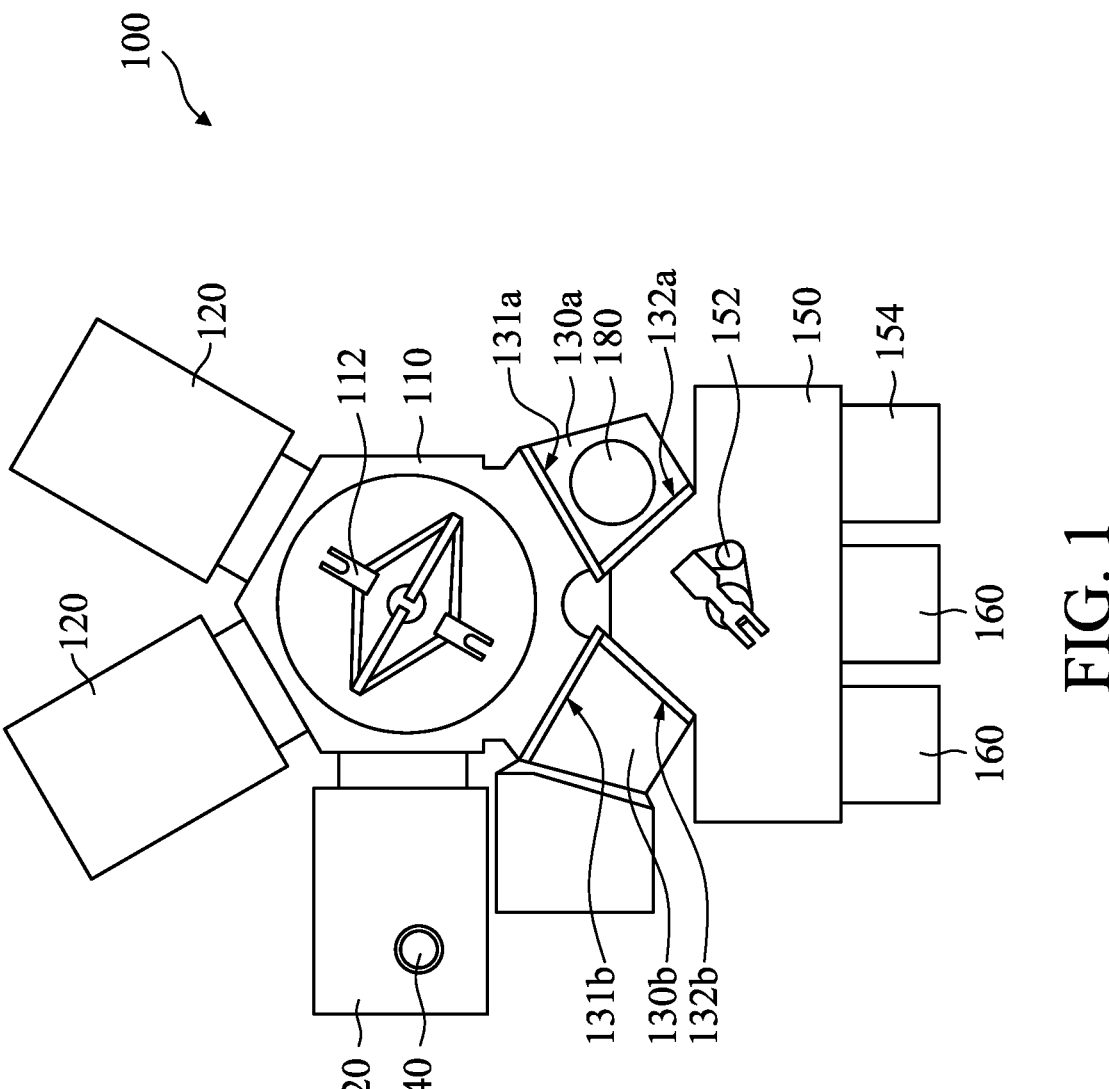
FIG. 1 illustrates an example of a tool for processing a semiconductor workpiece.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "left," "right," "horizontal," "vertical," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to a workpiece support for use in a semiconductor processing tool and methods of using such workpiece supports. When processing a workpiece or a tool component utilizing a workpiece support in accordance with embodiments of the present disclosure, the surface area size of contact points between the workpiece support and the underside of the workpiece or tool component is minimized such that the potential for damage to the underside of the workpiece or tool component is reduced. In addition, such contact points are located outside a lithography frame or other sensitive area on a side, e.g., front side, of the workpiece or tool component such that damage to the other side of the workpiece or tool component resulting from such contact will occur in an area of other side, e.g., backside, that is not overlapped by fabricated devices or other sensitive areas on the side of the workpiece or tool component. Both of these benefits will reduce scrapping of formed devices and improve production yields.

The defects at the backside surface of the workpieces or tool components may be scratches such as indentations, recesses, or some other type of defect that may be a result of contact with a workpiece support or transfer of debris from the workpiece support to the backside of the workpiece or tool component. In accordance with embodiments described herein, the workpiece includes a lithography frame, e.g., an EUV frame that corresponds to an area to be patterned with EUV radiation and processed to form semiconductor devices utilizing the workpiece. In some other alternative embodiments, when the workpiece is a tool component, the EUV frame may instead be an EUV reticle with or without an EUV pellicle that includes a pattern from which extreme ultra-violet light is reflected or through which EUV light is passed through to pattern a wafer aligned with the EUV reticle. However, for purposes of brevity and simplicity of the present disclosure, the critical or sensitive region or portion of a workpiece or tool component will be referred to as a lithography frame in the present disclosure. As used herein, workpiece refers to both a workpiece in which semiconductor devices are formed and tool components that include a lithography reticle, such as an EUV reticle.

When the sensitive or critical region of a workpiece is a lithography frame, such as an EUV frame region of a workpiece, that is being processed and refined by the utilization of various tools to manufacture semiconductor devices, a defect region overlapping into the sensitive or critical region may result in the manufacturing of defective semiconductor devices that do not function within selected tolerances. In other words, the defect region may result in several semiconductor devices being manufactured that are not readily usable as the defects at the defect region may result in the semiconductor devices being defective (e.g., do not function within the selected tolerances). In view of this discussion, the embodiments of a workpiece support and methods of using a workpiece support are desirable for reducing a likelihood of the defects caused by a backside of a workpiece contacting a support structure of a semiconductor processing tool.

FIG. 1 is a schematic plan view of a tool 100 for processing a workpiece, such as a semiconductor workpiece, in which a workpiece support in accordance with some embodiments of the present disclosure may be implemented. The tool 100 includes a polyhedral transfer chamber 110, at least one processing chamber 120, at least one load lock chamber, and in the illustrated embodiment at least one electron beam (e-beam) source 140. In other embodiments, the at least one electron beam source 140 is omitted. For example, in FIG. 1, the tool 100 includes the polyhedral transfer chamber 110, three of the processing chambers 120, two of the load lock chambers 130*a* and 130*b*, and the radiation source 140. The polyhedral transfer chamber 110 includes a central transfer mechanism 112 which performs the physical transfer of a wafer 180. The polyhedral transfer chamber 110 is connected to the processing chambers 120 and the load lock chambers 130*a* and 130*b*. This configuration allows the central transfer mechanism 110 to transport at least one wafer 180 between the processing chambers 120 and the load lock chambers 130*a* and 130*b*. In some embodiments, a plurality of the wafers 180 can be transported in the tool 100.

The sealed design of the tool 100 protects the wafer 180 from outside contaminants, but many of the manufacturing procedures carried out within the tool 100 may result in residues that are capable of damaging the wafer 180. For the purposes of the embodiments of this disclosure, residue may refer to a liquid film, a solid contaminant with or without the potential to outgas, particulate matter, any combination thereof, and/or any other undesirable compound in solid, liquid, or gaseous form. Examples of manufacturing procedures that may leave a residue on the wafer 180 include wet etching, dry etching, ashing, stripping, metal plating, chemical mechanical polishing (CMP), deposition, annealing, cooling and/or any other suitable procedure. To illustrate, dry etching process gases can include an oxygen-containing gas, fluorine-containing gas (e.g., $NF_3$, $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases or plasmas, and/or combinations thereof. Sulfur, fluorine, chlorine, bromine and other reactive atoms may bond to photoresist during dry etching and later outgas to form destructive compounds including $SO_2$ and HF. Wet etching procedures apply etchants (e.g., $HNO_3$, HF, KOH, and/or TMAH) to the wafer 180. These etchants may remain on the wafer 180 after the etching is completed. Stripping processes can leave residues of cleaning solutions including $H_2SO_4$ (sulfuric acid) and $H_2O_2$ (hydrogen peroxide).

Residue damage is not limited to direct harm to the wafer 180 through such processes as hazing, erosion, and corrosion. Residue may trap particulate matter, distort lithographic imaging, and prevent other process chemicals from performing a desired effect. Residues can form directly on the wafer 180 through manufacturing procedures, can condense on the wafer 180 from the ambient environment, and can be deposited by other mechanisms. Therefore, the embodiments in this disclosure are associated with the reduction of the residues to improve yield of the wafer 180.

Continuing to refer to FIG. 1, the processing chamber 120 may be configured to perform a manufacturing procedure on a semiconductor workpiece, such as a semiconductor wafer 180. Wafer manufacturing procedures include deposition processes such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and/or other deposition processes; etching processes including wet and dry etching and ion beam milling; lithographic exposure; ion implantation; thermal processes such as annealing, thermal oxidation and/or cooling; cleaning processes such as rinsing and/or plasma ashing; chemical mechanical polishing or chemical mechanical planarizing (CMP) processes; testing; other procedure involved in the processing of the wafer 180; and/or any combination of procedures. In some embodiments, the processing chambers 120 in FIG. 1 may be configured to perform the same or different manufacturing procedure(s) on the wafer 180 according to real situations.

The area of the tool 100 defined by the polyhedral transfer chamber 110 and the processing chambers 120 is sealed. Atmospheric controls, including filtering, provide an environment with extremely low levels of particulates and airborne molecular contamination (AMC), either of which may damage the wafer 180 or require that the wafer 180 be scrapped. By creating a microenvironment within the tool 100, the processing chambers 120 can be operated in a cleaner environment than the surrounding facilities. This allows tighter control of contaminates during wafer processing at reduced cost.

The tool 100 further includes an equipment front end module (EFEM) 150. The load lock chambers 130*a* and 130*b* preserve the atmosphere within the polyhedral transfer chamber 110 and processing chambers 120 by separating them from the EFEM 150. That is, the polyhedral transfer chamber 110 is connected to the EFEM 150 through the load lock chambers 130*a* and 130*b*. The load lock chamber 130*a* includes two doors, a polyhedral transfer chamber door 131*a* and a load lock door 132*a*, and the load lock chamber 130*b* includes two doors, a polyhedral transfer chamber door 131*b* and a load lock door 132*b*. The wafer 180 is inserted into the load lock chamber 130*a* and both doors are sealed. The load lock chamber 130*a* is capable of creating an atmosphere compatible with the EFEM 150 or the polyhedral transfer chamber 110 depending on where the loaded wafer 180 is scheduled to be next. This may alter the gas content of the load lock chamber 130*a* by such mechanisms as adding purified gases or creating a vacuum, along with other suitable means for adjusting the load lock chamber atmosphere. When the correct atmosphere has been reached, the corresponding door may be opened, and the wafer 180 can be accessed.

The EFEM 150 provides a closed environment in which to transfer the wafer 180 into and out of the tool 100. The EFEM 150 includes a load lock mechanism 152 which performs the physical transfer of the wafer 180. The wafer 180 is loaded through a load port 154. In FIG. 1, the wafer 180 arrives at the load port 154 contained in a transport carrier 160 such as a front-opening unified pod (FOUP), a front-opening shipping box (FOSB), a standard mechanical interface (SMIF) pod, and/or other suitable container. The transport carrier 160 is a magazine for holding one or more wafers 180 and for transporting wafers 180 between manufacturing tools. In some embodiments, the transport carrier 160 may have features such as coupling locations and electronic tags to facilitate use with an automated materials handling system. The transport carrier 160 is sealed in order to provide a microenvironment for the wafer 180 contained within and to protect the wafer 180 and the tool 100 against contamination. To prevent loss of the controlled atmosphere, the transport carrier 160 may have a door designed such that the transport carrier 160 remains sealed until it is docked with the load port 154.

In use, the central transfer mechanism 112 receives a workpiece and transports the workpiece to a processing chamber 120. Within processing chamber 120 is located a workpiece support, e.g., workpiece support 200 described below with reference to FIGS. 2 and 2A which, among other things, receives the workpiece 180 and supports the workpiece during processes that are carried out in the processing chamber. In some embodiments, when supported by the workpiece support 200, gravity maintains the position of the workpiece 180. If the workpiece support is capable of moving, inertial forces of the workpiece with respect to the workpiece support tend to limit a speed of travel of the workpiece support. Electrostatic forces or vacuum suction forces may be used to attract the workpiece to the workpiece support. The workpiece support may include retaining surfaces and/or retaining members that cooperate with a periphery of the workpiece and help retain the workpiece on the workpiece support.

Figure 2:
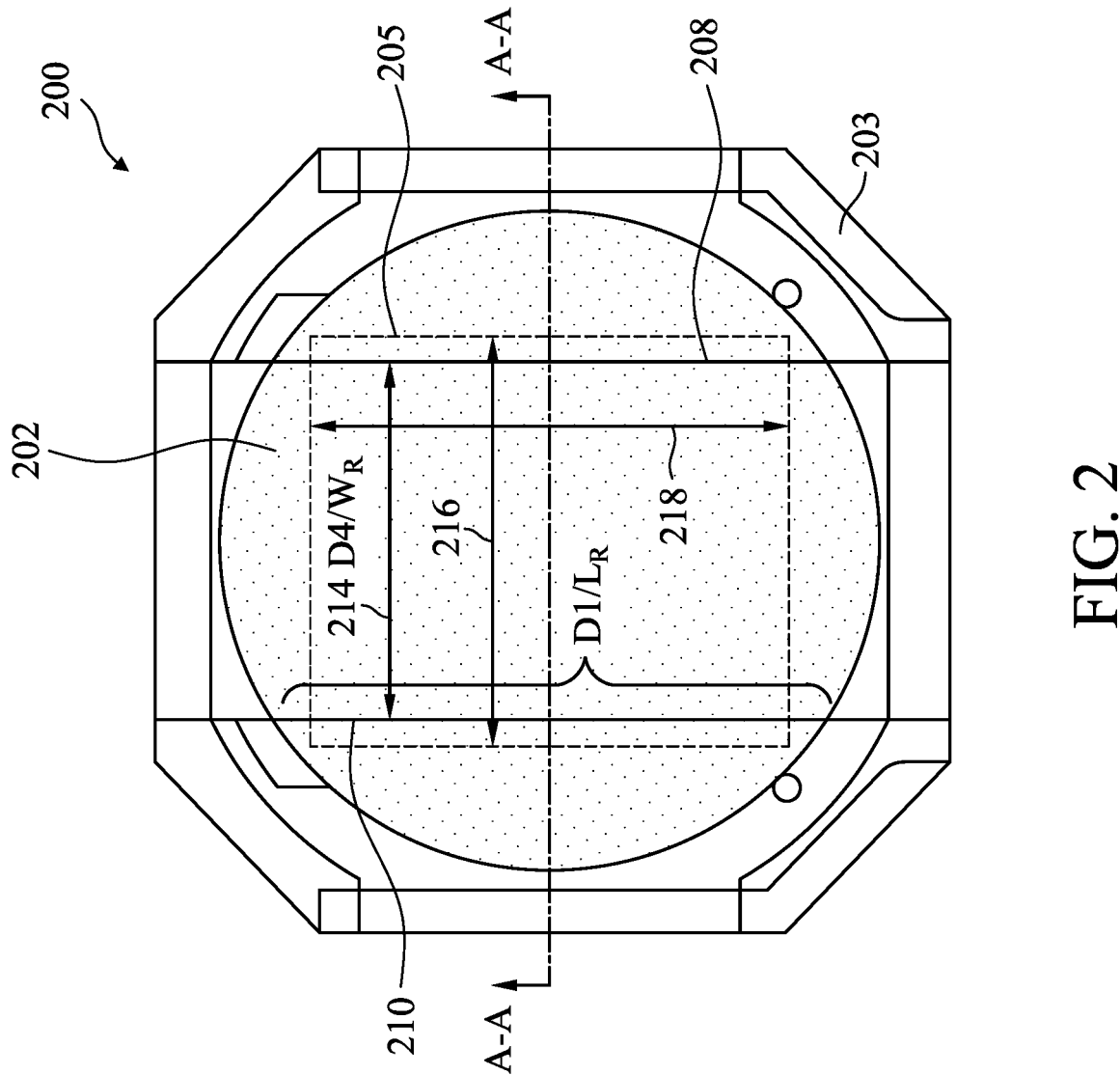
FIGS. 2 and 2A illustrate a wafer supported by a wafer support.
Figure 2A:
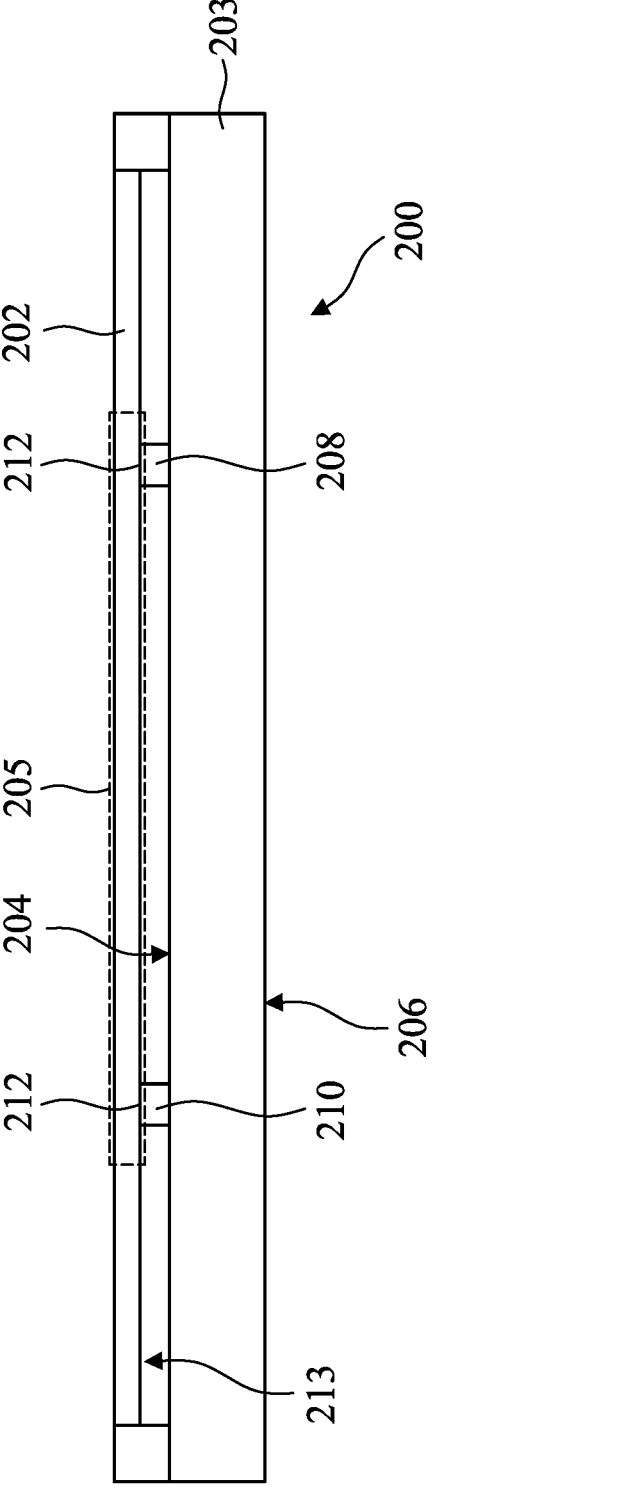

Referring to FIGS. 2 and 2A, an example of a suitable workpiece includes a semiconductor wafer 202 that has been or will be processed in a lithography tool, such as an EUV lithography tool. Semiconductor wafer 202 includes a rectangular area delineated by the broken line 205 centered on the wafer. This area will be referred to herein as a sensitive area 205. In an embodiment, the sensitive area 205 is an area of wafer 202 that has been or will be exposed to EUV radiation or other radiation during a lithography process, i.e., an EUV frame. Embodiments of the present disclosure are not limited to workpieces that have or will be processed in a lithography tool and include an EUV frame. Embodiments of the present disclosure apply to other workpieces that include sensitive areas on a frontside of the workpiece that are not an EUV frame.

FIG. 2 is a top view of a workpiece support 200 supporting a workpiece 202 that may be used in a semiconductor processing tool. FIG. 2A is a side view of a cross-section of workpiece support 200 in FIG. 2 taken along line A-A in FIG. 2. Referring to FIGS. 2 and 2A, workpiece support 200 includes an octagonal base 203 including an upper surface 204 and an opposing lower surface 206. Though not illustrated, lower surface 206 may be connected to other components of a semiconductor tool and may cooperate with such other components to move workpiece support 200 horizontally or vertically or in other directions, e.g., rotation or tilting. For example, the workpiece support 200 may cooperate with transfer mechanism 112 to receive a workpiece or to transfer a workpiece to the transfer mechanism. Upper surface 204 of workpiece support base 203 includes a plurality of support rails 208 and 210. In FIGS. 2 and 2A, the workpiece support base 203 includes support rail 208 and support rail 210 located on upper surface 204 of workpiece support 200. In FIGS. 2 and 2A, the underside of workpiece 202 rests upon an upper surface 212 of support rails 208 and 210. The upper surfaces 212 of support rails 208 and 210 are spaced from lower surfaces of support rails 208 and 210, respectively. These lower surfaces of support rails 208 and 210 are connected to, contact, or rest upon upper surface 204 of base 203. Upper surfaces 212 of support rails 208 and 210 extend along the full length of support rails 208 and 210. Accordingly, portions of a side, e.g., an underside, of workpiece 202 resting on upper surfaces 212 of support rails 210 and 208 contact upper surface 212 along the full dimension D1, e.g., a length $L_R$, of the contact surface between the underside of workpiece 202 and the upper surfaces 212. Portions of the underside of workpiece 202 that do not rest on upper surfaces 212 of support rails 208 and 210 are spaced apart from upper surface 204 of base 203, e.g., by an air gap. These portions of the underside of workpiece 202 that do not rest on upper surfaces of support rails 208 and 210 do not contact other portions of the upper surface of base 203. In FIGS. 2 and 2A, the EUV frame 205 has a dimension D2 216, e.g., a width W, and a dimension D3 218, e.g., a length L. Support rails 208 and 210 are separated by a dimension D4 214, e.g., a width $W_R$. In FIG. 2, D4 214 is less than D2 216 and D1 is larger than D3 218, which results in the EUV frame 205 overlapping portions of support rails 208 and 210. In some embodiments, D3 is about 80% or more of D1 and D2 is larger than D4, accordingly a large portion if not all of the underside 213 of workpiece 202 that directly overlaps support rails 208 and 210 contacts the upper surfaces 212 of support rails 208 and 210. The effect of portions of the underside 213 of workpiece 202 overlapping and contacting upper surfaces 212 of supports rails 208 and 210 are described in more detail with reference to FIGS. 3 and 4.

Figure 3:
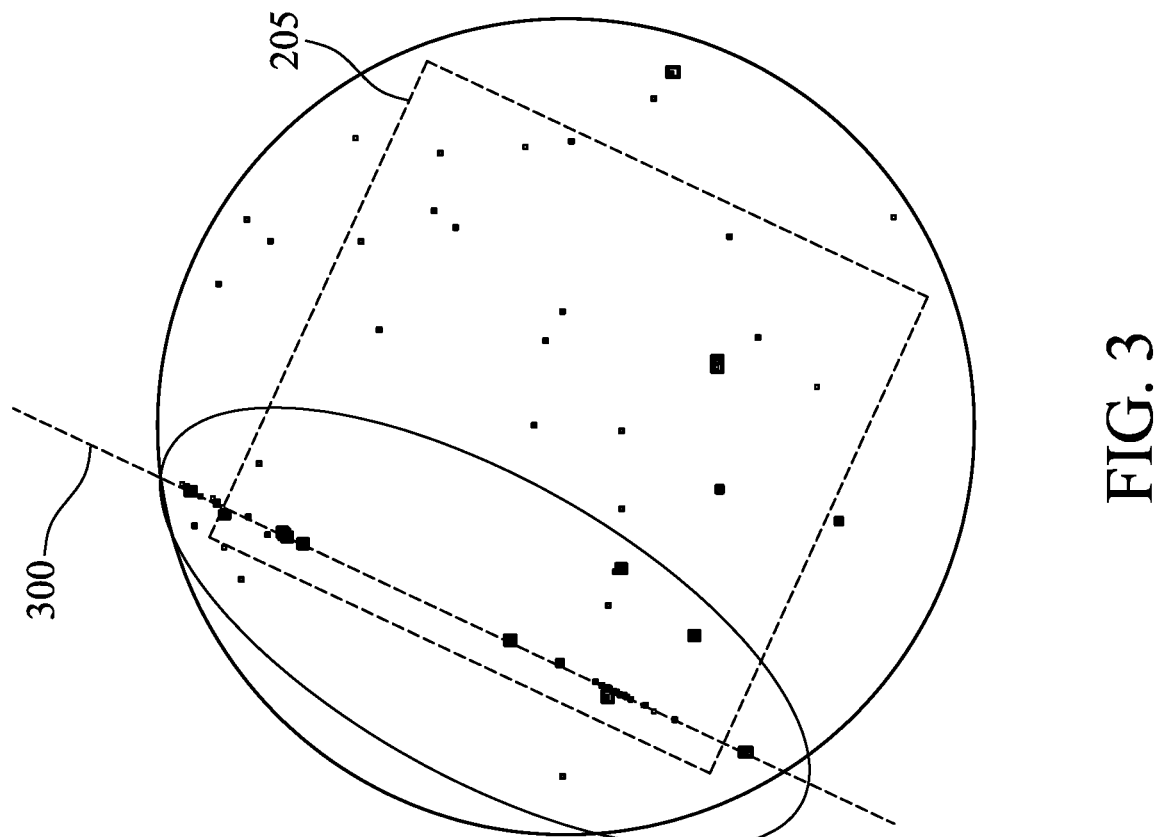
FIG. 3 is a defect map of defects on a backside surface of a workpiece that has been supported on the wafer support of FIG. 2.
Figure 4:
FIG. 4 illustrates an example of a size distribution of defects on a backside of a workpiece that has been supported on the wafer support of FIG. 2.

Referring to FIGS. 3 and 4, the present inventors have observed a higher concentration of defects on the underside surface 213 of workpiece 202 along the contact surface between the underside 213 of workpiece 202 and upper surface 212 of rail 208 and rail 210 compared to other portions of the underside of workpiece 202, e.g., portions of the underside of workpiece 202 that did not contact upper surface 212 of rails 208 or 210 or an upper surface of other portions of base 203. FIG. 3 is a defect map of an underside of a workpiece 202 that has been supported by a workpiece support 200 of FIGS. 2 and 2A and subjected to a semiconductor process, e.g., a cooling process, in a semiconductor tool. FIG. 4 is a bar chart illustrating the size distribution of the defects identified in FIG. 3. In FIG. 3, while defects are distributed on the underside of workpiece 202 across the underside surface of workpiece 202, line 300 identifies an area of higher concentration of defects. The present inventors observed that line 300 corresponds to a location where a portion of the underside of workpiece 202 contacts upper surface 212 of one of rails 208 and 210. As illustrated in FIG. 2, line 300 falls within the EUV frame 205. Because devices or structures that have been formed within EUV frame 205 will need to be scrapped if they include defects on their backside, it is desirable to reduce the concentration of defects that form on the underside of workpiece 202, especially within the EUV frame 205 and especially along the surface of the underside of workpiece 202 that contacts one or more of rails 208 and 210.

Embodiments in accordance with the present disclosure provide a workpiece support that reduces the number of defects resulting from the underside of the workpiece contacting portions of the workpiece support, especially portions of the underside of the workpiece that are overlapped by the EUV frame. Workpiece supports in accordance with embodiments of the present disclosure are able to support and process workpieces while minimizing the number of defects, e.g., transfer of contaminants from rails 208 and 210 to the underside of the workpiece or damage to the underside of the workpiece as a result of contact with rails 208 and 210.

Figure 5:
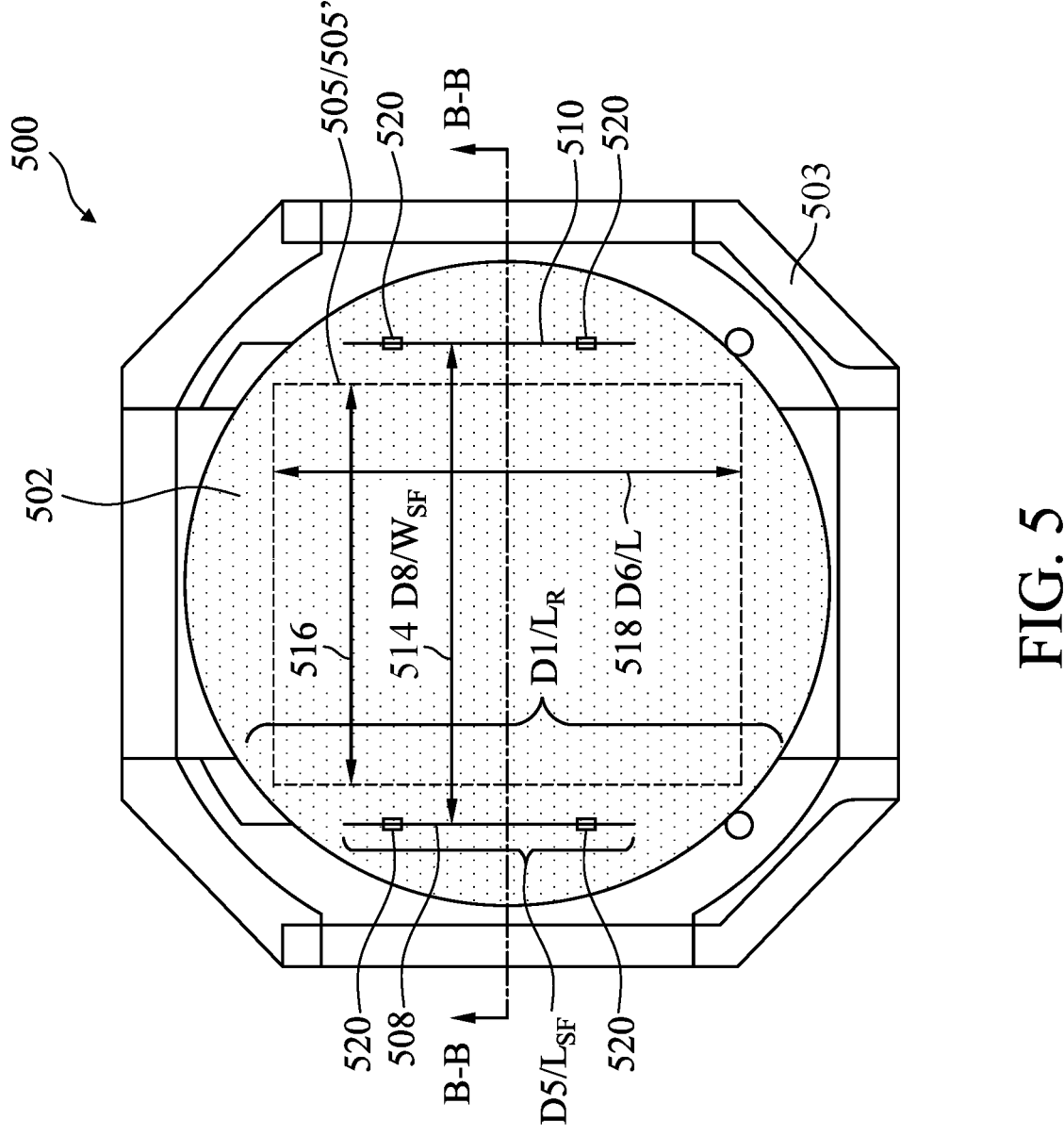
FIGS. 5 and 5A illustrate an example of a workpiece on a wafer support, in accordance with the embodiments of the present disclosure.
Figure 5A:
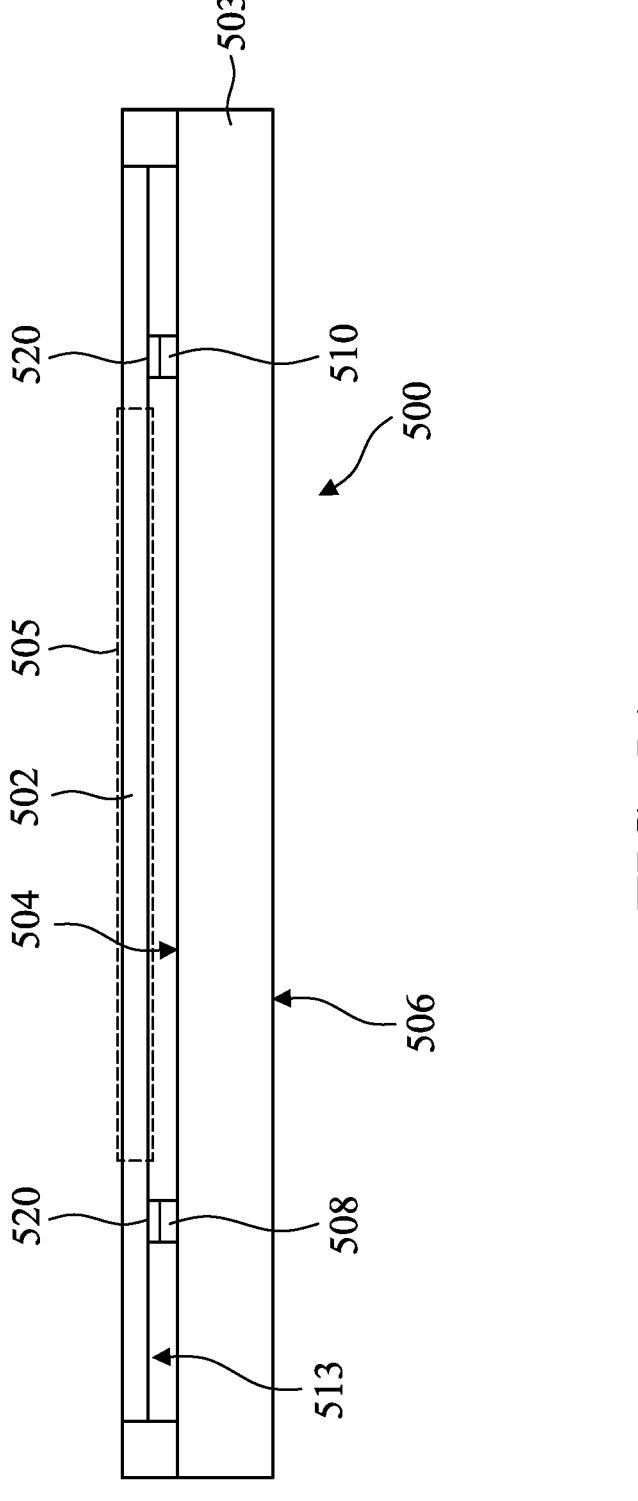

Referring to FIGS. 5 and 5A, a workpiece support 500 in accordance with embodiments of the present disclosure is illustrated. FIG. 5 is a top plan view of such a workpiece support 500 and FIG. 5A is a cross-section view of workpiece support 500 taken along line B-B in FIG. 5. In FIGS. 5 and 5A, a suitable workpiece includes a semiconductor wafer 502 that has been or will be processed in a lithography tool, such as an EUV lithography tool. In other embodiments, a suitable workpiece includes a semiconductor tool component, such as a reticle, for use in a lithography process. Semiconductor wafer 502 includes a sensitive area 505, e.g., a rectangular lithography frame 505, e.g., an EUV lithography frame delineated by the broken line centered on the wafer. As noted previously, an EUV frame 505 is an area of wafer 202 that has been or will be exposed to EUV radiation or other radiation during a lithography process. When the workpiece 202 is on workpiece support 500 and supported by workpiece support 500, EUV frame 505 overlaps workpiece support 500. As used herein, the phrase lithography frame refers to frame 505 on workpiece 502 or a frame 505' on workpiece support 500. A frame 505' refers to that portion of the workpiece support 500 that lies directly beneath frame 505 when a workpiece with a frame 505 is positioned on workpiece support 500. Frame 505' on workpiece support 500 is a superimposed version of frame 505 of workpiece 500. Frame 505' is generally overlapped by frame 505 of the workpiece.

The workpiece support 500 supporting a workpiece 502 may be used in a semiconductor processing tool. The illustrated embodiment of a workpiece support 500 includes an octagonal base 503 including a first surface, e.g., an upper surface 504 and a second surface, e.g., an opposing lower surface 506. Though not illustrated, lower surface 506 may be connected to other components of a semiconductor tool and may cooperate with such other components to move workpiece support 500 horizontally or vertically or in other directions, e.g., rotation or tilting. For example, the workpiece support 500 may cooperate with transfer mechanism 112 in FIG. 1 to receive a workpiece or to transfer a workpiece to the transfer mechanism. Upper surface 504 of workpiece support base 503 includes a plurality of support frames 508 and 510. In FIGS. 5 and 5A, the support frame 508 and support frame 510 are located on upper surface 504 of workpiece support 500.

Figures 7A, 7B, 7C:
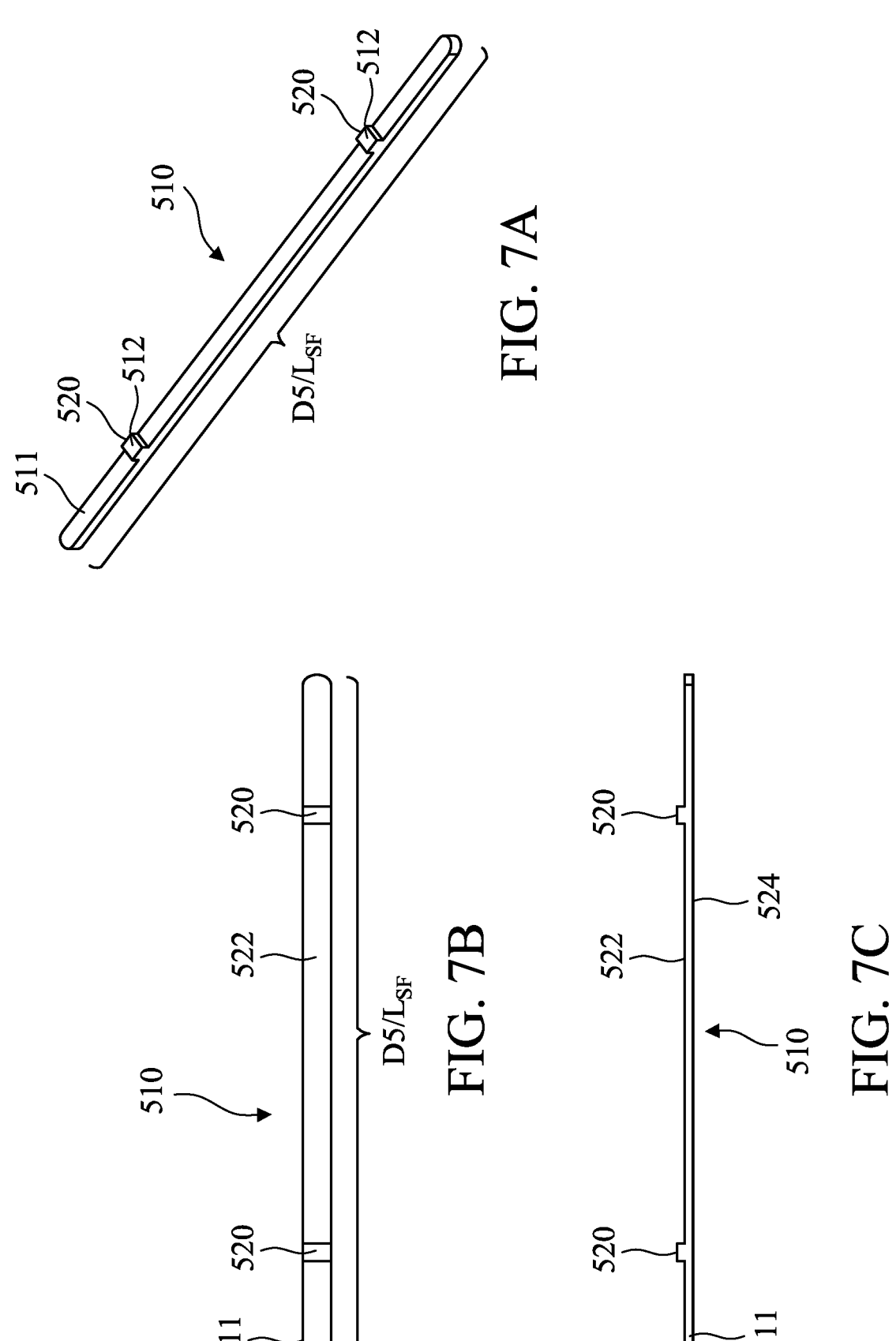
FIGS. 7A-7C illustrate an example of a support component of the wafer support of FIG. 5, in accordance with the embodiments of the present disclosure.

Referring to FIGS. 7A-7C, an embodiment of a support frame that can be utilized as support frame 508 and support frame 510 is illustrated. FIG. 7A is a perspective view of support frame 510, FIG. 7B is a top plan view of support frame 510 and FIG. 7C is a side elevation view of support frame 510. The following description of a support frame proceeds with reference to support frame 510; however, this description is equally applicable to support frame 508.

In the embodiment illustrated in FIGS. 7A-7C, support frame 510 includes an elongate rectangular body 511 having a dimension D5, e.g., length $L_{SF}$, of rectangular body 511, and a first surface 522, e.g., an upper surface 522, and a second opposing surface, e.g., a lower surface 524. In the embodiment illustrated in FIGS. 7A-7C, upper surface 522 of support frame 510 includes a plurality spacers, e.g., pin supports 520. In FIGS. 7A-7C, two pin supports 520 are illustrated; however, in accordance with other embodiments of the present disclosure, support frame 510 may include more than two pin supports 520 or may, in some embodiments, include less than two pin supports 520. In accordance with some embodiments, support frame 510 may include X number of pin supports 520 and support frame 508 may include Y number of pin supports 520, where X does not equal Y. For example, support frame 510 may include two or more spacers, e.g., pin supports 520, and support frame 508 may include less than two spacers, e.g., one pin support 520. Each pin support 520 includes an upper surface 512 in FIG. 7A. As illustrated in FIG. 5A, underside 513 of workpiece 502 is supported by upper surface 512 of support pins 520. In accordance with embodiments of the present disclosure, the underside 513 of workpiece 502 contacts support frame 510 only at upper surface 512 of support pins 520. In the embodiment of FIGS. 5-7C, portions of support frame 510 other than the support pins 520 do not contact the underside 513 of workpiece 502. Further details regarding pin supports 520 are described below.

Figure 6:
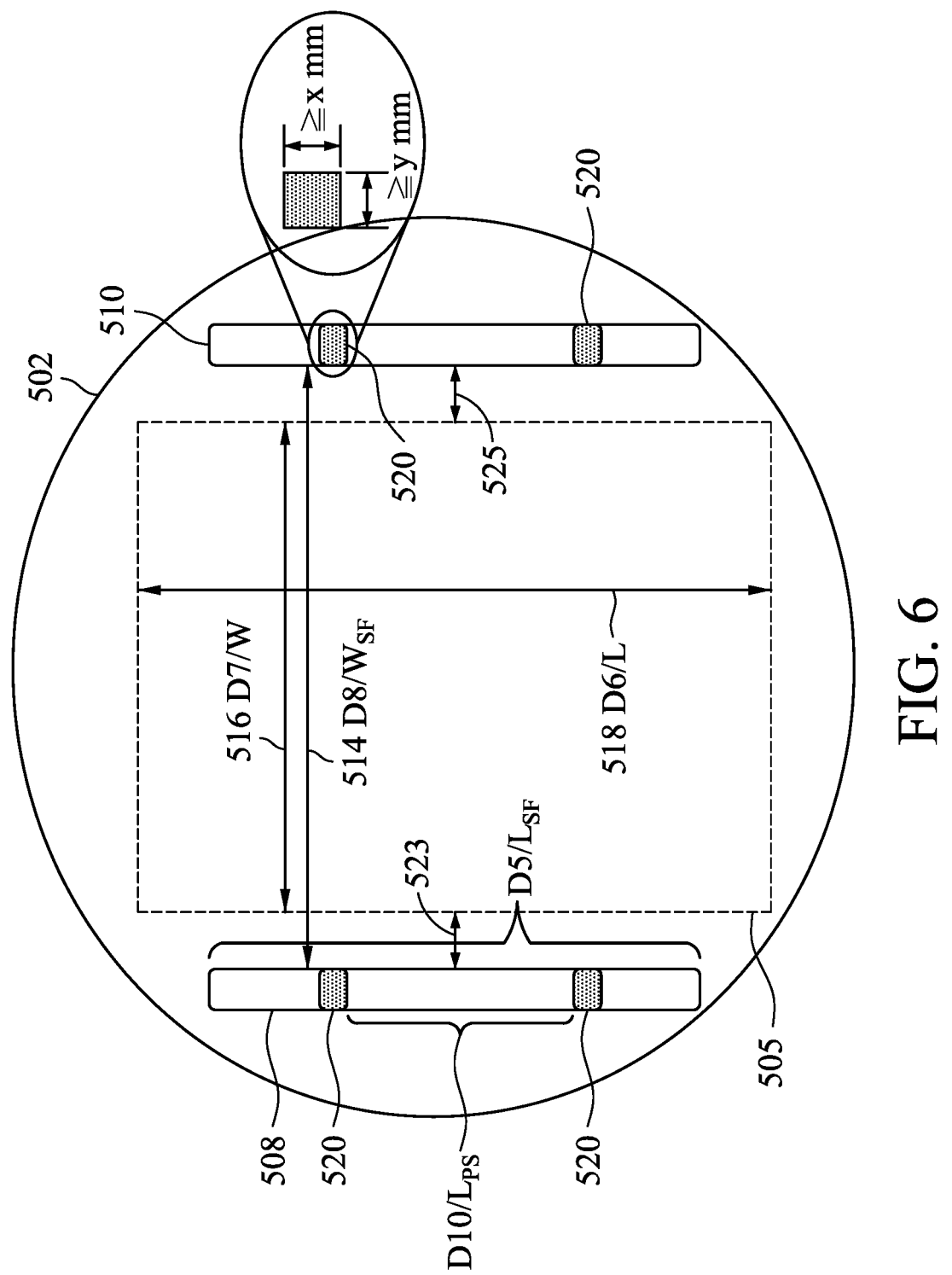
FIG. 6 illustrates further details of an example of the wafer support of FIG. 5, in accordance with the embodiments of the present disclosure.

In the embodiments of FIGS. 7A-7C, when viewed from above as in FIG. 6, the spacers have a polygonal shape, e.g., rectangular, square, etc. In other embodiments, the spacers have a non-polygonal shape, e.g., round, oval, etc.

In FIGS. 5, 5A and 6, the underside 513 of workpiece 502 rests upon an upper surface 512 of support pins 520 of support frames 508 and 510. The upper surface 512 of support pins 520 is spaced from an upper surface 522 of support frame body 511. Support frame body 511 also includes a lower surface 524 opposite upper surface 522. Lower surface 524 of support frame body 511 contacts base 503 of workpiece support 500 or is machined to be integral with base 503 of workpiece support 500. As briefly noted above, portions of upper surface 522 of support frame body 511 that are not occupied by pin supports 520 are spaced apart from upper surface 512 of pin supports 520 such that the underside 513 of a workpiece 502 resting on upper surface 512 of pin supports 520 is spaced apart from and does not contact upper surface 522 of support frame body 511.

Support frames 508 and 510 are positioned on base 503 of workpiece support 500 such that they are parallel to the dimension D6, e.g., length L 518 of the EUV frame 505. In other embodiments, support frames 508 and 510 are positioned on base 503 of workpiece support 500 such that they are parallel to the dimension D7, e.g., width W 516 of the EUV frame 505. In FIGS. 5 and 6, support frame 508 and support frame 510 are spaced apart a distance D8, e.g., width $W_{SF}$ 514. EUV frame 505 has a dimension D7, e.g., width W that is less than dimension D8. Accordingly, support frame 508 is spaced apart from and adjacent edge of EUV frame 505 by a distance 523 equal to a fraction of the difference between dimension D7/W and dimension D8/$W_{SF}$. Similarly, support frame 510 is spaced apart from and edge of EUV frame by a distance 525 equal to the complement of the fraction of the difference between dimension D7/W and dimension D8/$W_{SF}$. Support frame 508 and support frame 510 lie to the exterior of the EUV frame 505 and are not overlapped by EUV frame 505. In accordance with some embodiments, the distance 523 and 524 or greater than or equal to 1 mm. When the distances 523 or 524 are greater than or equal to one mm, the likelihood of the support frames 508 or 510 overlapping the EUV frame 505 and possibly coming in contact with a pellicle within the EUV frame is minimal. In contrast, when the distances 523 or 524 are less than one mm, the likelihood of the support frames 508 or 510 overlapping the EUV frame 505 and possibly coming in contact with a pellicle within the EUV frame increases.

In embodiments of FIGS. 5, 5A and 6, where the support frame 508 and support frame 510 are positioned on base 503 of workpiece support 500 such that they are parallel to the dimension D7/W, e.g., width dimension of EUV frame 505, support frame 508 and support frame 510 are separated by a dimension $D8/W_{SF}$ that is greater than the dimension D7/W of EUV frame 505. Accordingly, support frame 508 and support frame 510 in this configuration lie to the exterior of the EUV frame 505 and are not overlapped by EUV frame 505.

In the illustrated embodiment of FIG. 6, dimension D5, e.g., length $L_{SF}$ of support frame 508 and 510, is less than dimension D6/L of EUV frame 505 and is not so long that portions of support frames 508 and 510 are not overlapped by workpiece 502 when workpiece 502 is positioned on workpiece support 500. In other embodiments, $D5/L_{SF}$ can be greater than dimension D6/L of EUV frame 505, again provided $D5/L_{SF}$ is not so great that portions of support frames 508 and 510 are not overlapped by workpiece 502 when workpiece 502 is positioned on workpiece support 500. In FIG. 6, pin supports 520 of support frame 510 are separated by a dimension D10, e.g., a length $L_{PS}$. $D10/L_{PS}$ can vary in magnitude. For example, in the embodiment of FIG. 6, $D10/L_{PS}$ can be 50% or more of $D5/L_{SF}$, but not so long that the pin supports 520 extend beyond the ends of support frame body 511. In other embodiments in accordance with FIG. 6, $D10/L_{PS}$ is 50% or more of D6/L, but again, not so long that the pin supports 520 extend beyond the ends of support frame body 511. When $D10/L_{PS}$ falls within these ranges, the spacing between pin supports 520 of support frames 508 and 510 is sufficient to stably support workpiece 502. $D10/L_{PS}$ can fall outside these ranges, e.g., be less than 50% of $D5/L_{SF}$ or D6/L, provided the pin supports 520 of support frame 510 and support frame 508 stably support workpiece 502.

In embodiments where the dimension D6/L of support frames 508 and 510 are parallel to the dimension D7/W of EUV frame 505, $D5/L_{SF}$ is less than dimension D7/W of EUV frame 505 and not so long that portions of support frames 508 and 510 are not overlapped by workpiece 502 when workpiece 502 is positioned on workpiece support 500. In other embodiments, $D5/L_{SF}$ can be greater than D7/W of EUV frame 505, again provided $D5/L_{SF}$ is not so long that portions of support frames 508 and 510 are not overlapped by workpiece 502 when workpiece 502 is positioned on workpiece support 500. When the dimension $D5/L_{SF}$ of support frames 508 and 510 are parallel to the dimension D7/W dimension of EUV frame 505, pin supports 520 of support frame 510 are separated by a distance $D10/L_{PS}$. $D10/L_{PS}$ can vary in magnitude. For example, $D10/L_{PS}$ can be 50% or more of $D5/L_{SF}$, but not so long that the pin supports 520 extend beyond the ends of support frame body 511. In other embodiments when the dimension D6/L of support frames 508 and 510 are parallel to the dimension D7/W of EUV frame 505, $D10/L_{PS}$ is 50% or more of D7/W, but again, not so long that the pin supports 520 extend beyond the ends of support frame body 511. When $D10/L_{PS}$ falls within these ranges, the spacing between pin supports 520 of support frame 510 is sufficient to stably support workpiece 502. $D10/L_{PS}$ can fall outside these ranges, e.g., be less than 50% of $D5/L_{SF}$ or D7/W, provided the pin supports 520 of support frame 510 and support frame 508 stably support workpiece 502.

Referring to FIG. 6, further details regarding pin supports 520 is provided below. In the embodiment illustrated in FIG. 6, upper surface 512 of pin supports 520 has a dimension y and a dimension x. In some embodiments, the dimension x is a length and the dimension y is a width of upper surface 512 of pin support 520 and is measured in the same direction as the length dimension L and the width dimension W of EUV frame 505. In other embodiments, the dimension x is a width and the dimension y is a length of upper surface 512 of pin support 520. The dimensions x and y are chosen so that the area of the contact surface between the underside of the workpiece 502 is large enough that the likelihood that pressure between the workpiece 502 and the upper surface of pin supports 520 will result in damage to the wafer is minimized. In the embodiment of FIG. 6, upper surface 512, pin supports 520 has a dimension x that is greater than or equal to one millimeter and a dimension y that is greater than or equal to 1 mm. When the area of the upper surface of the pin supports is one square millimeter or more, the likelihood that pressure between the workpiece 502 and the upper surface of pin supports 520 will result in damage to the wafer is minimized. In contrast, when the area of the upper surface of the pin supports is one square millimeter or less, the likelihood that pressure between the workpiece 502 and the upper surface of pin supports 520 will result in damage to the wafer is greater. When upper surface 512 of pin supports 520 has dimensions falling within the foregoing ranges, the upper surface of pin supports provides stable support for workpiece 502. In some embodiments, x and y are equal. In other embodiments, x and y are not equal. Embodiments in accordance with the present disclosure are not limited to pin supports 520 that having x and y dimensions within the above described ranges. For example, embodiments in accordance with the present disclosure include support pins that have a dimension x that is less than 1 mm and/or a dimension y that is less than 1 mm.

The upper surface 512 of pin supports 520 includes materials that will not have an adverse effect on or damage the underside 513 of workpiece 502 when workpiece 502 is supported by pin supports 520. Examples of suitable materials include ceramic or other inert materials. Such materials may be attached to the top of pin supports 520 or such materials may be formed on, e.g., deposited on, the top of pin supports 520. Upper surface 512 of pin supports 520 can be spaced apart from upper surface 522 of support frame 510 by a distance that can vary. For example, in some embodiments, upper surface 512 of pin supports 520 is spaced apart from upper surface 522 of support frame 510 by a distance that is between 50% and 80% of the distance between upper surface 522 and lower surface 524 of support frame body 511. Embodiments in accordance with the present disclosure are not limited to pin supports 520 wherein upper surface 512 is spaced apart from upper surface 522 of support frame 510 by a distance that falls within the foregoing range. In other embodiments, the upper surface 512 can be spaced apart from upper surface 522 of support from 510 by a distance that falls outside the foregoing range.

In accordance with embodiments of the present disclosure, only small portions of the underside 513 of workpiece 502 comes in contact with upper surface 512 of pin supports 520. Portions of the underside 513 of workpiece 502 that do not rest on upper surface 512 of support pins 520 are spaced apart from upper surface 504 of base 503 and upper surface 522 of support body frame 511, e.g., by an air gap. These portions of the underside 513 of workpiece 502 that do not rest on upper surface 512 of pin supports 520 of support frames 508 and 510 do not contact other portions of the upper surface of base 503. Reducing the surface area of the underside 513 of workpiece 502 that comes into contact with portions of workpiece support 500 reduces the surface area of the underside 513 of workpiece 502 that can be damaged or contaminated by coming into contact with portions of workpiece support 500. Reducing such damage or contamination will result in less scraping and loss of fabricated devices. In addition, positioning the pin supports 520 such that they contact the underside 513 of the workpiece 502 outside of the EUV frame 505 also reduces the likelihood that such contact will damage or contaminate the underside of the workpiece at locations where devices have been formed on the top side of the workpiece. This will also result in less scrapping and loss of fabricated devices.

In the embodiments above, pin supports 520 are described as components of support frame body 510. Embodiments of the present disclosure are not limited to pin supports that are on a support body. For example, in other embodiments pin supports are on upper surface 504 of base 503 of workpiece support 500. The above description of pin supports 520 is equally applicable to pin supports that are on upper surface 504 of base 503.

As is readily apparent in view of the above discussion, when the workpiece is a tool component, such as an EUV reticle, instead of a wafer with an EUV frame, locations and areas of the backside surface of the EUV reticle do not contact respective surfaces of the workpiece support, thereby reducing the likelihood of defects (e.g., scratches, indentions, recesses, accumulation of debris, etc.) on the backside surface of the EUV reticle.

To summarize, processing a workpiece utilizing a workpiece support in accordance with embodiments of the present disclosure, the surface area size of contact points between the workpiece support and the underside of the workpiece are minimized such that the potential for damage to the underside of the workpiece is reduced. In addition, such contact points are located outside the EUV frame or other sensitive area on the workpiece such that damage to the backside of the workpiece resulting from such contact will occur in an area of the backside that is not overlapped by fabricated devices or a sensitive area on the other side of the workpiece. Both of these benefits will reduce scrapping of formed devices.

Figure 8:
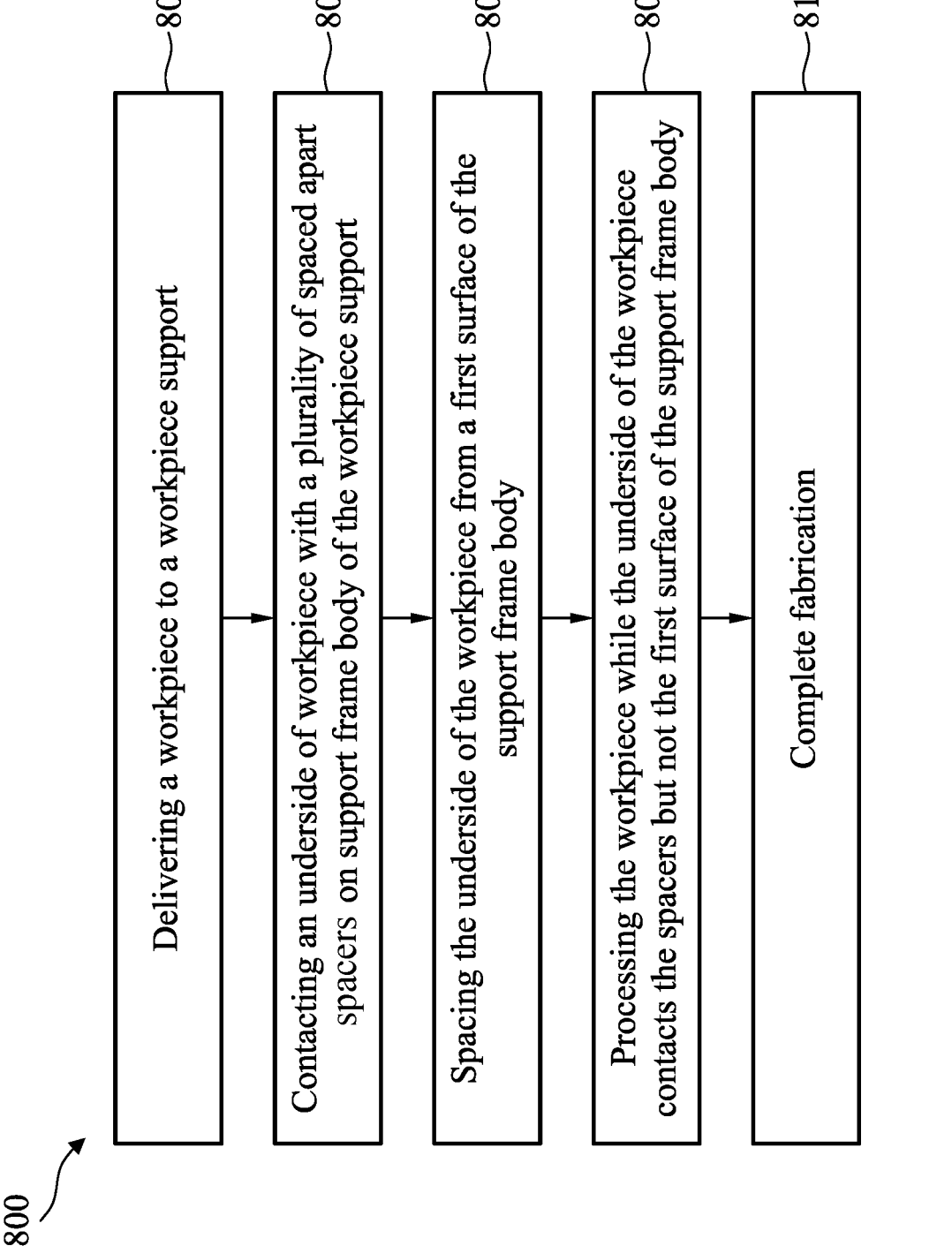
FIG. 8 is a flow chart of a method utilizing a wafer support in accordance with embodiments of the present disclosure.

FIG. 8 is directed to a block diagram 800 illustrating a process for processing a workpiece utilizing a workpiece support in accordance with embodiments of the present disclosure. In a first step 802, a workpiece, e.g., a semiconductor wafer, is delivered by a transfer mechanism robot to a processing chamber of a semiconductor processing tool that includes a workpiece support upon which the workpiece rests while being processed within the workpiece tool. An example of a processing chamber, transfer robot and semiconductor tool useful in step 802 includes one of the processing chambers 120 of semiconductor tool 100 and central transfer mechanism 112 illustrated in FIG. 1.

In a second step 804, after the central transfer mechanism 112 delivers the workpiece to a processing chamber 120, the workpiece is received by a workpiece support contained within the processing chamber. The workpiece support contacts an underside of the workpiece at a plurality of spaced apart spacers. The plurality of spaced apart spacers are on a support frame body of the workpiece support. When the workpiece is received by the workpiece support, portions of the underside of the workpiece that do not contact the spacers do not come in contact with other portions of the support frame body. Examples of a workpiece support, spacers and support frame body include the workpiece support 500 of FIG. 5, spacer 520 of FIGS. 6 and 7A-7C and support frame body 511 of FIGS. 7A-7C.

In the third step 806, as a result of the underside of the workpiece contacting the workpiece support at spacers and not contacting the workpiece support at other portions of the workpiece support, the underside of the workpiece is spaced from a first surface of the support frame body. These surfaces of the underside of the workpiece that are spaced apart from the support frame body do not contact the support frame body of the workpiece support. Reducing contact between the underside of the workpiece and portions of the workpiece support result in a reduction in defect formation or accumulation of unwanted debris on the backside surface of the workpiece.

In a fourth step 808, the workpiece which is resting on the workpiece support as described above is processed within the processing tool. In accordance with embodiments of the present disclosure, those portions of the underside of the workpiece that do not contact the support frame body exhibit a reduced formation of defects and/or accumulation of unwanted debris compared to portions of the underside of the workpiece that do contact the support frame body. Examples of processes carried out in the chamber include patterning, developing, depositing, etching, annealing, cooling, drying, cleaning and the like. After step 808, the process proceeds to step 810 which includes further processing to complete the fabrication of the device.

In view of the above discussion, the workpiece support of the present disclosure as shown in FIGS. 5-7C supports a workpiece in a manner that minimizes the physical contact between the workpiece support in the underside of the workpiece. By doing so, damage or accumulation of debris associated with portions of the underside of workpiece support that come in contact with the workpiece support is minimized. The workpiece support includes a base that has an upper surface and a lower surface. In operation the upper surface of the base is overlapped by a workpiece including a lithography frame. The lithography frame has a length dimension L and a width dimension W. The upper surface of the base includes a support frame having a support frame body. The support frame body includes an upper surface and a lower surface opposite the upper surface. The support frame is not overlapped by the lithography frame when the workpiece is supported by the workpiece support. The support frame body includes a plurality of spaced apart spacers on its upper surface. Each of the spacers includes an upper surface that is spaced apart from the upper surface of the support frame body.

In another embodiment, a workpiece support includes a base that includes an upper surface and a lower surface opposite the upper surface. In operation, the base includes a lithography frame. The lithography frame of the base is a portion of the base that is overlapped by the lithography frame of a workpiece when a workpiece is on the workpiece support. This lithography frame has a first dimension and a second dimension. Two support frames are provided on the upper surface of the base outside the lithography frame. Each support frame includes a support frame body having an upper surface and a lower surface opposite the upper surface. The support frames are spaced apart a dimension that is greater than the first dimension or the second dimension of the lithography frame. The upper surface of the support frames include a plurality of spaced apart spacers. Each of the plurality of spacers includes an upper surface spaced apart from the upper surface of the support frame body.

Another embodiment of the present disclosure includes a method of processing a semiconductor workpiece. Such method includes delivering a workpiece to a workpiece support in a semiconductor processing chamber. The workpiece support includes a base having an upper surface, a lower surface opposite the upper surface and a lithography frame. The lithography frame includes a length dimension L and a width dimension W. The process includes contacting an underside of the workpiece with a plurality of spaced apart spacers present on an upper surface of each of two support frame bodies on the base. The plurality of spacers includes an upper surface spaced apart from an upper surface of the support frame bodies. According to this embodiment, the support frame bodies are spaced apart a width dimension $W_{SF}$ that is greater than the width dimension W.

Embodiments in accordance with the present disclosure increase the surface area of sensitive areas of a workpiece that are not contacted by features of a workpiece support. The above increase in size of the sensitive or critical region or portion of a workpiece that is not contacted by features of the workpiece support allows for a greater number of semiconductor devices to be manufactured utilizing the workpiece by reducing the overall waste while also improving efficiency of the manufacturing process of the semiconductor devices. For example, when a workpiece support formed in accordance with the present disclosure or methods that utilize a workpiece support in accordance with the present disclosure are utilized, a greater number of semiconductor devices may be manufactured more efficiently and quickly with reduced waste as compared to when a workpiece support contacts larger areas of the underside of a workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A workpiece support, comprising:
a base, the base including a first surface and a second surface opposite the first surface, in operation, the base supporting a semiconductor wafer that includes a lithography frame region in which circuits are to be patterned via lithography, the lithography frame region having a first length dimension and a first width dimension;
a first support frame on the first surface, the first support frame including a first support frame body having a first surface and a second surface opposite the first surface; and
a plurality of spaced apart first spacers that extend outward from the first surface of the first support frame body, the plurality of spaced apart first spacers are first pin supports, each respective first pin support of the plurality of first pin supports including a first workpiece contact surface that is spaced outward from the first surface of the first support frame body;
wherein the first support frame and each respective first pin support of the plurality of spaced apart first pin supports are entirely overlapped by the semiconductor wafer outside the lithography frame region when the semiconductor wafer is on the workpiece support, and are exposed by the lithography frame region such that the support frame and the plurality of first pin supports contacts are separate from the lithography frame region; and
wherein each of the first workpiece contact surfaces of each respective first pin support of the plurality of first pin supports are sized and arranged to contact an underside of the semiconductor wafer outside the lithography frame region and leave the lithography frame region uncovered, and the plurality of first pin supports are configured to, in operation, support the semiconductor wafer in a position with the first workpiece contact surfaces of each respective first pin support of the plurality of first pin supports and space apart an underside surface of the semiconductor wafer from the first support frame body.

2. The workpiece support of claim 1, wherein the first support frame body of the first support frame is integral with the base.

3. The workpiece support of claim 2, wherein the first support frame body has a second length dimension and two respective first pin supports of the plurality of first pin supports are spaced apart by a first distance and the second length dimension is greater than the first distance.

4. The workpiece support of claim 3, wherein the first distance is 50% or more of the second length dimension.

5. The workpiece support of claim 1, wherein the first workpiece contact surface of each respective first pin support of the plurality of pin supports is formed of an inert material.

6. The workpiece support of claim 1, wherein each respective first pin support of the plurality of first pin supports is polygonal in shape.

7. The workpiece support of claim 1, further comprising a second support frame on the first surface of the base.

8. The workpiece support of claim 7, wherein the second support frame includes a second support frame body having a third surface and a fourth surface opposite the second surface and a plurality of spaced apart second spacers that extend outward from the third surface of the second support frame body, the plurality of spaced apart second spacers are second pin supports, and each respective second pin support of the plurality of second pin supports includes a second workpiece contact surface that is spaced outward from the third surface of the second support frame body of the second support frame.

9. The workpiece support of claim 8, wherein the entire second support frame, is overlapped by the semiconductor wafer when the semiconductor wafer is on the workpiece support and is uncovered by the lithography frame region.

10. The workpiece support of claim 8, wherein the first support frame and the second support frame are spaced apart by a second distance which is greater than the first width dimension.

11. The workpiece support of claim 7, wherein the first support frame includes two first pin supports and the second support frame includes only one second spacer, and the second spacer is a second pin support.

12. A workpiece support, comprising:
a base, the base including a first surface and a second surface opposite the first surface, the workpiece being a semiconductor wafer having a lithography frame region on the semiconductor wafer for circuit patterning, the lithography frame region having a first dimension and a second dimension;
two support frames on the first surface of the base, each respective support frame of the two support frames are located entirely outside the lithography frame region, each support frame of the two support frames including a support frame body having a length dimension, a third surface, and a fourth surface opposite the third surface, the two support frames spaced apart by a third dimension that is greater than the length dimension;

a plurality of spaced apart pin supports that extend outward from the first surface of each respective support frame body of the two support frames, each respective pin support of the plurality of pin supports including a workpiece contact surface spaced apart from the first surface of a corresponding support frame body of the two support frames;

wherein each support frame of the two support frames and each respective pin support of the plurality of pin supports are fully overlapped by the semiconductor wafer and is separate from the lithography frame region, such that the lithography frame region remains uncovered;

wherein an underside of the semiconductor wafer contacts the workpiece contact surfaces of the plurality of pin supports outside the lithography frame region to avoid contact with the lithography frame region, and the plurality of pin supports are configured to, in operation, support the semiconductor wafer in a position with the workpiece contact surfaces of each respective pin support of the plurality of pin supports and space apart the underside surface of the semiconductor wafer from the respective support frame body of the two support frames.

13. The workpiece support of claim 12, wherein the first dimension is less than the second dimension.

14. The workpiece support of claim 12, wherein the two support frames are parallel with each other.

15. The workpiece support of claim 12, wherein the respective pin supports of the plurality of pin supports that extend from each respective support frame body of the two support frames are spaced apart by a fourth dimension which is 50% or more of the first dimension.

16. The workpiece support of claim 12, wherein the respective pin supports of the plurality of pin supports that extend from each respective support frame body of the two support frames are spaced apart by a fourth dimension which is 50% or more of the length dimension.

17. A method, comprising:

delivering a workpiece in the form of a semiconductor wafer to a workpiece support, the workpiece support including a base having a first surface, a second surface opposite the first surface, and a pair of support frame bodies on the first surface, each respective support frame body of the pair of support frame bodies including a plurality of spaced apart spacers that extend outward from each respective support frame body of the pair of support frame bodies, the plurality of spaced apart spacers are pin supports, the semiconductor wafer including a lithography frame region having a length dimension and a width dimension defining an area for circuit lithography, each of the pair of support frame bodies are exposed by the lithography frame;

contacting an underside of the semiconductor wafer outside the lithography frame region with the plurality of pin supports on a respective surface of each respective support frame body of the pair of support frame bodies, the plurality of pin supports extend outward from each respective surface of each respective support frame body of the pair of support bodies; and overlapping the two support frame bodies and the plurality of pin supports with portions of the semiconductor wafer lying outside the lithography frame region, so that the lithography frame region remains uncovered, each respective pin support of the plurality of pin supports including a workpiece contact surface spaced apart from a corresponding respective surface of each respective support frame body of the pair of support frame bodies, the pair of support frame bodies being spaced apart by a width distance that is greater than the width dimension of the lithography frame region, and the plurality of pin supports space apart the underside of the semiconductor wafer from each respective surface of the respective support-bodies frame body of the pair of support bodies.

18. The method of claim 17, further comprising processing the semiconductor wafer while the underside of the semiconductor wafer contacts the plurality of spaced apart spacers.

19. The method of claim 18, wherein the processing the semiconductor wafer while the underside of the semiconductor wafer contacts the plurality of spaced apart spacers further includes processing the semiconductor wafer on the workpiece support while portions of the underside of the semiconductor wafer are not in contact with portions of the pair of support frame bodies that are overlapped by the semiconductor wafer.

20. The method of claim 18, wherein the processing the workpiece while the underside of the workpiece contacts the plurality of spaced apart spacers further includes processing the workpiece on the workpiece support while portions of the underside of the workpiece are spaced apart from the first surface of the pair of support frame bodies.

* * * * *